US006921972B1

(12) United States Patent
Hashemi

(10) Patent No.: US 6,921,972 B1
(45) Date of Patent: *Jul. 26, 2005

(54) LEADLESS CHIP CARRIER DESIGN AND STRUCTURE

(75) Inventor: Hassan S. Hashemi, Laguna Niguel, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/713,834

(22) Filed: Nov. 15, 2000

Related U.S. Application Data

(63) Continuation of application No. 09/252,851, filed on Feb. 17, 1999, now Pat. No. 6,191,477.

(51) Int. Cl.[7] .......................... H01L 23/10; H01L 23/34
(52) U.S. Cl. ....................................... 257/707
(58) Field of Search ................. 257/780; 774/737, 774/738, 706, 707, 712

(56) References Cited

U.S. PATENT DOCUMENTS

| | | | | |
|---|---|---|---|---|
| 5,506,755 A | * | 4/1996 | Miyagi et al. | 257/706 |
| 5,640,048 A | * | 6/1997 | Selna | 257/738 |
| 5,646,826 A | * | 7/1997 | Katchmar | 361/704 |
| 5,721,454 A | * | 2/1998 | Palmer | 257/700 |
| 5,786,628 A | * | 7/1998 | Beilstein, Jr. et al. | 257/684 |
| 5,808,873 A | * | 9/1998 | Celaya et al. | 361/760 |
| 5,814,889 A | * | 9/1998 | Gaul | 257/773 |
| 5,923,084 A | * | 7/1999 | Inoue et al. | 257/712 |
| 6,097,089 A | * | 8/2000 | Gaku et al. | 257/712 |
| 6,191,477 B1 | * | 2/2001 | Hashemi | 257/706 |
| 6,201,300 B1 | * | 3/2001 | Tseng et al. | 257/706 |
| 6,226,183 B1 | * | 5/2001 | Weber et al. | 361/704 |
| 6,236,366 B1 | | 5/2001 | Yamamoto et al. | |
| 6,265,767 B1 | * | 7/2001 | Gaku et al. | 257/678 |
| 6,265,771 B1 | * | 7/2001 | Ference et al. | 257/706 |

(Continued)

FOREIGN PATENT DOCUMENTS

EP     2-58358     2/1990

(Continued)

OTHER PUBLICATIONS

Fujitsu Limited, Presentation slides regarding "BCC (Bump Chip Carrier)", 24 pages, 1997, United States.

*Primary Examiner*—David A. Zarneke
(74) *Attorney, Agent, or Firm*—Farjami & Farjami LLP

(57) ABSTRACT

A semiconductor device is provided in the form of a chip carrier (e.g., chip/IC scale carrier for RF applications) that includes an integrated circuit chip attached to a die attach pad. The device has an interconnect substrate having an upper surface and a lower surface, with a plurality of vias passing through the thickness of the interconnect substrate from the upper surface to the lower surface. The die attach pad is located on the upper surface of the interconnect substrate, and a heat spreader is located on the lower surface of the interconnect substrate. A first group of vias is positioned to intersect both the die attach pad and the heat spreader. A second group of vias is positioned away from the die attach pad and the heat spreader. The upper surface has a plurality of bond pads that are abutting the second group of vias and the lower surface has a plurality of lands that are also abutting the second group of vias.

25 Claims, 4 Drawing Sheets

U.S. PATENT DOCUMENTS

| | | | |
|---|---|---|---|
| 6,265,772 B1 * | 7/2001 | Yoshida | 257/712 |
| 6,281,042 B1 * | 8/2001 | Ahn et al. | 438/108 |
| 6,282,095 B1 * | 8/2001 | Houghton et al. | 361/704 |
| 6,421,013 B1 | 7/2002 | Chung | |
| 6,611,055 B1 * | 8/2003 | Hashemi | 257/706 |

FOREIGN PATENT DOCUMENTS

| | | |
|---|---|---|
| EP | 9-153679 | 10/1997 |
| EP | 10-313071 | 11/1998 |
| EP | 10-335521 | 12/1998 |

* cited by examiner

LEADLESS CHIP CARRIER DESIGN AND STRUCTURE

This is a continuation of application Ser. No. 09/252,851 filed Feb. 17, 1999 now U.S. Pat. No. 6,191,477.

BACKGROUND OF THE INVENTION

1. Field of the Invention

The present invention generally relates to electronic packaging, and more particularly, to a leadless chip carrier design and structure.

2. Description of the Related Art

The microelectronics industry has continued to make significant advances in semiconductor device technology. Semiconductor devices are getting smaller, more dense, and run at higher speeds. However, as device sizes decrease and electrical components are moved closer together, one of the limiting properties of the semiconductor device is the electrical parasitics caused by resistance, capacitance and inductance effects. This is particularly troubling in radio frequency (RF) devices, where it is important to minimize electrical parasitics and to be able to predict their effects reliably. Also, the need to control device generated heat has become more critical as the speeds and power consumption of semiconductor devices has increased.

Controlling electrical parasitics is also important at the packaging level. The structure that supports the semiconductor device (i.e., chip) is commonly referred to as an electronic package. The electronic package is designed to provide electrical interconnection for I/O, signal lines, power supplies, and ground, in addition to environmental and physical protection.

One advantageous form of packaging is the chip carrier which is gaining in popularity. A big reason for this is that chip carriers are very small in size and thus make it possible to fit many devices on a substrate such as a printed circuit board (PCB) or ceramic. The package, as part of the completed semiconductor device, must be low in electrical parasitics and have good thermal dissipation. This is especially important for RF applications.

Electrical parasitics, particularly inductance, are some of the parameters that can adversely affect the performance of electrical packages. Inductance is thus one parameter that should be controlled and reduced. One of the factors contributing to the inductance is the long printed traces found in most packages. Another factor is the lack of a good ground plane located close to the device.

Present packages also have problems with dissipating heat. As semiconductor devices have increased in performance, their power requirements have also increased dramatically. Because of the large amount of power needed to operate a chip, the heat generated by a chip can reach several watts. Dissipation of this heat is an important design consideration of both the chip and chip carrier. Since the chip and chip carrier are made from different materials, each having a different coefficient of thermal expansion, they will react differently to the heat generated by the chip and the outside environment. The resulting thermal stresses can reduce the life of the semiconductor device by causing mechanical failures. Thus, it is desirable to be able to predict accurately the thermal effects of the chip carrier so that the chip carrier can be designed accordingly.

Therefore, there exists a need for a small package for a semiconductor device that would provide low electrical parasitics, predictable heat dissipation along with an efficient ground plane.

SUMMARY OF THE INVENTION

In accordance with one embodiment of the present invention, a semiconductor device is provided in the form of a chip carrier that includes a semiconductor chip attached to the upper surface of an interconnect substrate. A die attach pad is provided on the upper surface of the interconnect substrate and the chip is attached to this pad. On the lower surface of the substrate is a heat spreader positioned beneath the die attach pad. A plurality of vias extend through the thickness of the substrate from the upper surface to the lower surface. A first group of these vias is positioned to intersect both the die attach pad and the heat spreader. A second group of these vias is positioned apart from both the die attach pad and the heat spreader. Bonding pads are positioned to abut the second group of vias on the upper surface of the interconnect substrate. Device electrodes on the semiconductor chip are electrically coupled to these bonding pads by wire bonds. Electrically conductive lands are positioned to abut the second group of vias on the lower surface of the interconnect substrate and can be used to connect the semiconductor device to a printed circuit board or other electronic equipment.

BRIEF DESCRIPTION OF THE DRAWINGS

A preferred embodiment of the invention is particularly pointed out and distinctly claimed in the concluding portion of the specification. The preferred embodiment, however, both as to organization and method of operation, may best be understood by reference to the following description taken in conjunction with the claims and the accompanying drawings, in which like parts may be referred to by like numerals:

DETAILED DESCRIPTION OF THE PREFERRED EXEMPLARY EMBODIMENTS

The present invention provides for a more efficient electronic device particularly suited for radio frequency (RF) applications by minimizing electrical parasitics and providing for predictable electrical and thermal performance. The electronic device in accordance with the invention is especially applicable to devices with up to approximately 64 leads, which is particularly suited to many RF and analog applications, but it will be readily appreciated that the following description also applies to packages of different sizes and different number of I/O pins.

Figure 1:
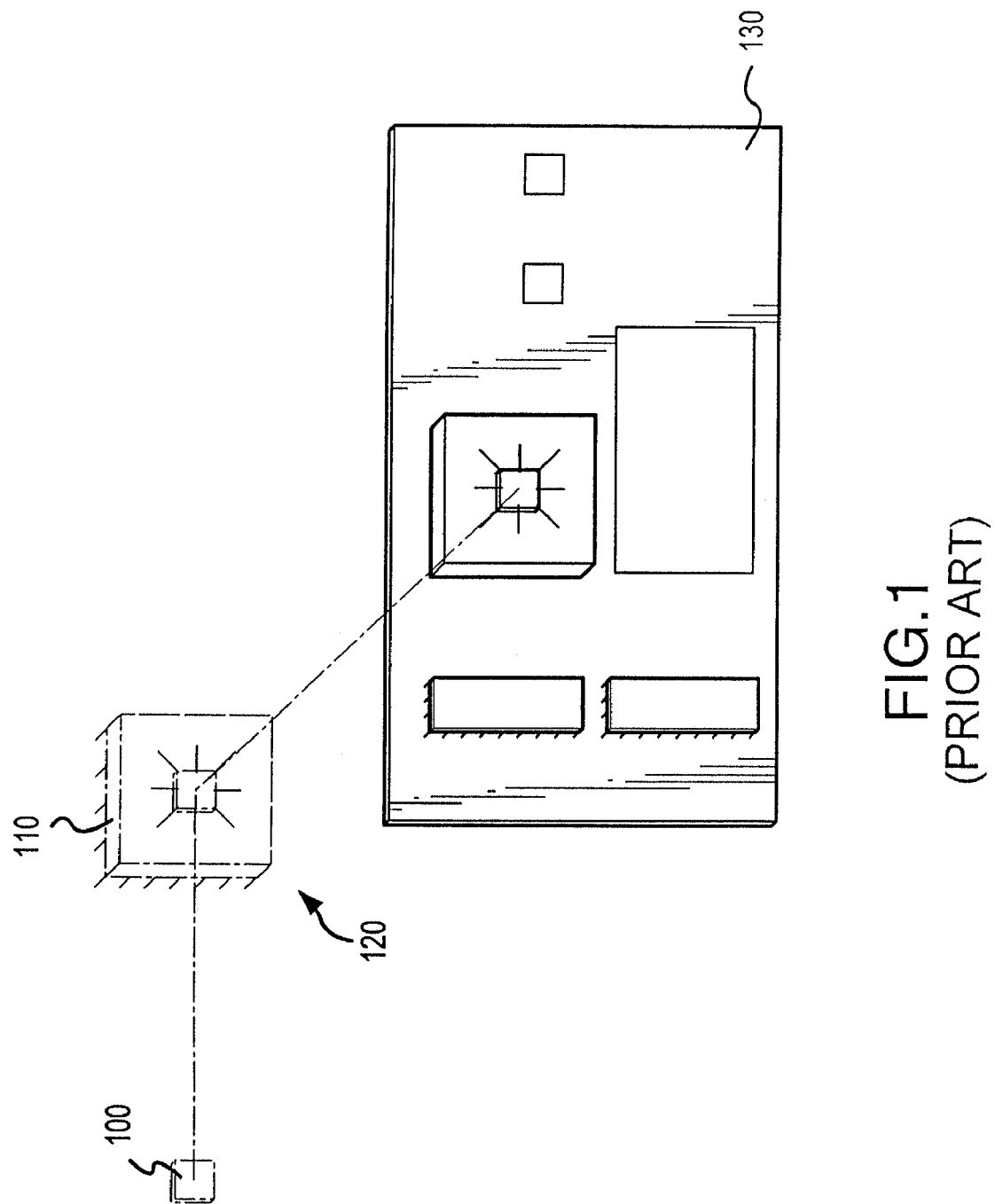
FIG. 1 illustrates an electronic packaging hierarchy.

Referring now to FIG. 1, an electronic packaging hierarchy is illustrated. A semiconductor device chip 100 is mounted on an electronic package 110 to form a semiconductor device 120. The resulting semiconductor device can be connected to a printed circuit board 130 that is plugged into a mother board (not shown).

Figure 2:
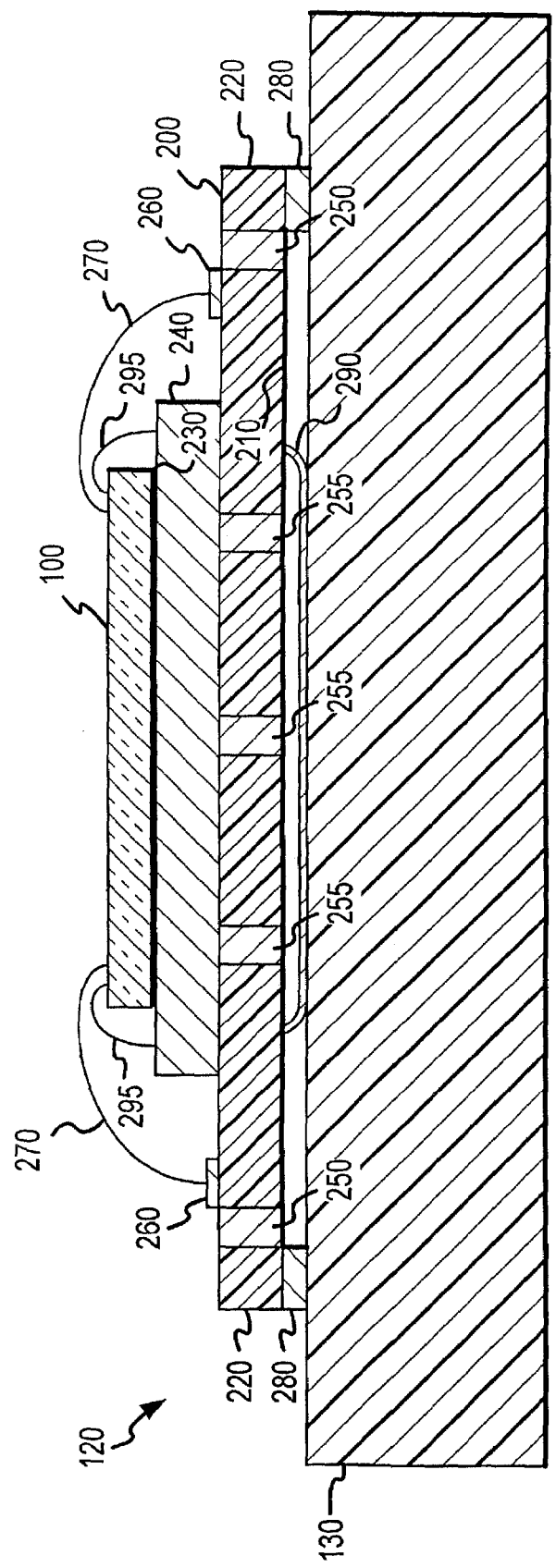
FIGS. 2–4 illustrate, in cross-sectional, top and bottom views, respectively, one embodiment of the invention.

FIG. 2 illustrates in cross-section, a semiconductor device 120 in accordance with a preferred embodiment of the present invention. Device 120 includes semiconductor device chip 100 which is preferably an integrated circuit (IC) chip. The semiconductor device also includes an interconnect substrate 220 having an upper surface 200 and a lower surface 210. The upper and lower surface of the interconnect substrate preferably are planar. Upper surface 200 of the interconnect substrate has a die attach bond pad 240 to which semiconductor device chip 100 is attached. Die attach bond pad 240 is a metallic pad formed of a metal that is highly conductive, both electrically and thermally. In the preferred embodiment, interconnect substrate 220 suitably comprises an organic (i.e., laminate) material such as a polytetrafluoroethylene (PTFE) or FR4 based laminate. However, other alternative embodiments may use other organic or non-organic (i.e., ceramic) materials for interconnect substrate 220.

Semiconductor device chip 100 is attached to die attach bond pad 240 of interconnect substrate 220 using a conventional conductive epoxy die attach epoxy 230. For example, an epoxy such as Ablebond 84-ILMIT or Sumitomo 1079B can be used. Alternatively, solder or other well known die attach material can be used depending on the interconnect substrate material and the intended use of the device.

A heat spreader 290 is located on lower surface 210 of interconnect substrate 220. Similar to die attach bond pad 240, heat spreader 290 is a metallic pad formed of a metal that is highly conductive, both electrically and thermally. As described below, heat spreader 290 is used to both electrically and thermally connect semiconductor device 120 to a printed circuit board (PCB).

A plurality of vias passes through the thickness of interconnect substrate from upper surface 200 to lower surface 210. Each of the vias is filled with a material such as copper that is both electrically and thermally conductive. The filled vias thus provide electrical and thermal pathways from upper surface 200 to lower surface 210.

A first group of vias 255 are illustrated in FIG. 2. First group of vias 255 is positioned to intersect both die attach pad 240 on the upper surface and heat spreader 290 on the lower surface 210 of interconnect substrate 220. First group of vias 255 thus provides for a good thermal and electrical connection from semiconductor device chip 100 to heat spreader 290 due to the presence of an electrical and thermal conductor such as copper.

Figure 3:
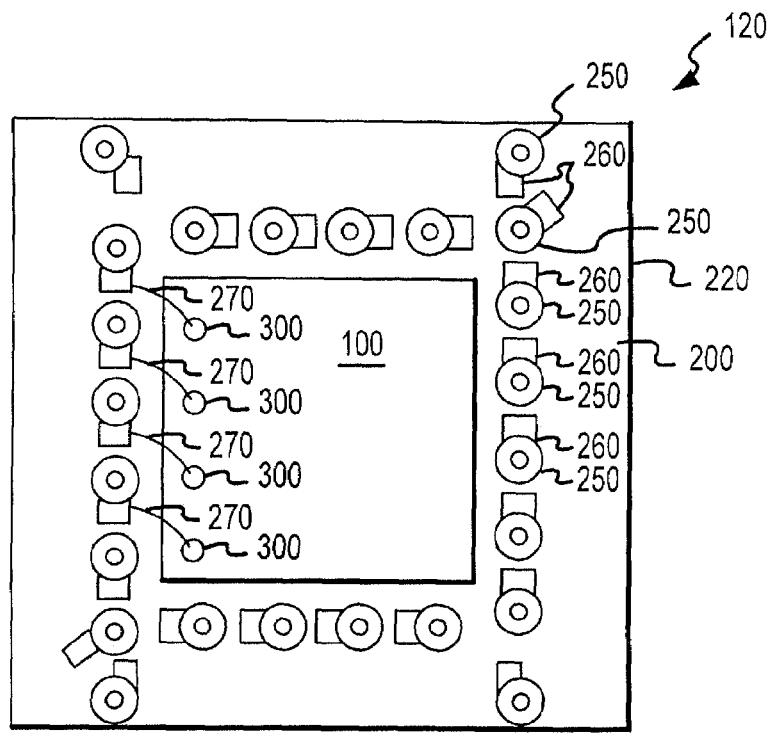

A second group of vias 250 is positioned about the periphery of and spaced away from semiconductor device chip 100 as is more clearly seen in FIG. 3. FIG. 3 illustrates semiconductor device 120 in top view. In accordance with the invention, a plurality of bond pads 260 is formed on upper surface 200 of interconnect substrate abutting the second group of vias 250. The plurality of bond pads is preferably positioned in a peripheral design along the perimeter of the upper surface of the interconnect substrate. However, it will be appreciated that the plurality of bond pads may be positioned in other designs such as either a regular or irregular array of columns and rows. Whatever the design, the second group of vias 250 and the array of bond pads 260 are designed so that the vias abut the pads.

Semiconductor device chip 100 includes a plurality of device electrodes 300 on its upper surface. These device electrodes 300 provide the means by which electrical contact, including I/O, power supplies, and ground, is made to the electrical circuit contained on semiconductor device chip 100. Electrical connection must be made from device electrodes 300 to bond pads 260 of interconnect substrate 220 and ultimately to the printed circuit board and the mother board.

Referring to FIGS. 2 and 3, in the preferred embodiment, semiconductor device chip 100 is electrically connected to interconnect substrate 220 of the chip carrier by a technique called wire bonding. In wire bonding, the electrical connections are made by bonding wires 270, preferably very small wires, between device electrodes 300 of the semiconductor device chip 100 to bond pads 260 on interconnect substrate 220. The bond attachment is completed by thermal compression bonding or other well known wire bonding methods. Typically, wires and bond pads that are gold or gold-plated, aluminum or an alloy of aluminum, or copper or an alloy of copper are used.

In accordance with the invention, as illustrated in FIG. 3, each of the plurality of bond pads 260 is located immediately adjacent to or abuts one of second group of vias 250. No traces are necessary between the bond pads and the vias, so parasitic inductance is reduced. The bond pads 260 are directly coupled to the plurality of lands 280 located on the lower surface 210 of the interconnect substrate 220 by the copper or other conductive material filling the vias. The lands 280 can be connected to a signal on the PCB 130 or to a ground or power source. It will be readily appreciated that this will reduce the electrical inductance of semiconductor device 120 as this minimizes the distance from bond pads 260 to vias 250. Thus, the flexibility of wire bonding can be utilized to pick the shortest path from semiconductor device chip 100 to bond pads 260 and the resultant inductance will be minimal. Space is saved since traces are not needed to connect bond pads 260 to vias 250. It has been found, for example, that what was previously a 9×9 mm 48 I/O package can be reduced to a 6×6 mm 48 I/O package. Therefore, the size of interconnect substrate 220 is only slightly larger than the size of semiconductor device chip 100.

Figure 4:
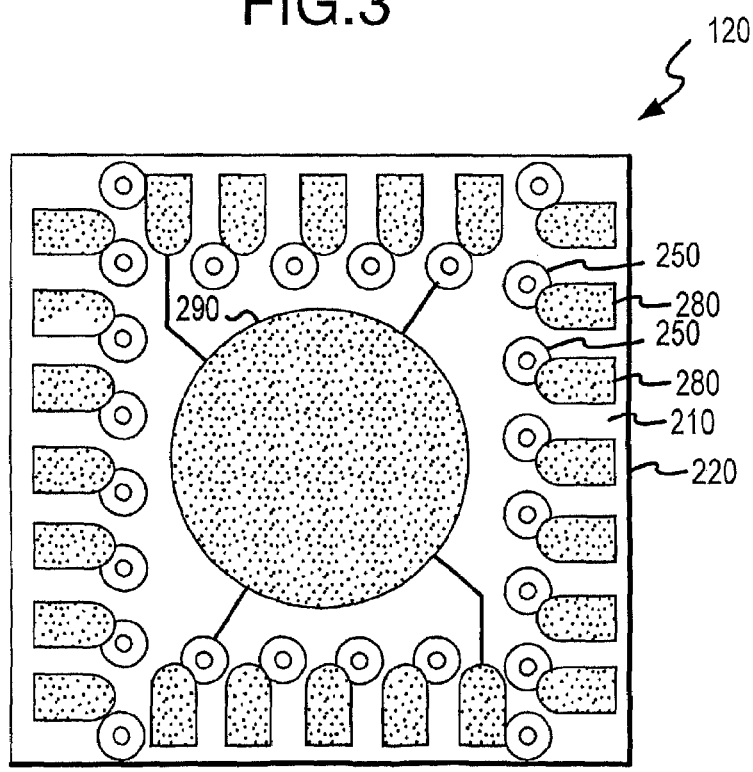

Referring now to FIG. 4, a bottom view of semiconductor device 120 according to a preferred embodiment of the present invention is illustrated. Second group of vias 250 passes through interconnect substrate 220 and are exposed on lower surface 210. Lower surface 210 of the interconnect substrate 220 also has a plurality of lands 280 and heat spreader 290. Lower surface 210 of interconnect substrate 220 is adapted to be attached to the printed circuit board (not shown) by soldering heat spreader 290 and plurality of lands 280 to corresponding metallization on the printed circuit board. Using heat spreader 290 to attach to the printed circuit board allows for a good thermal path at a very low thermal resistance. Large heat spreader 290 also helps to increase the reliability of the bonds to the plurality of lands 280 as is explained below.

There is increased reliability because the mechanical stress or physical displacement on the plurality of lands 280, due to the heating and cooling of the semiconductor device, is decreased due to the presence of large heat spreader 290. A difference may exist in the coefficient of thermal expansion (CTE) between the semiconductor device and the PCB because they may be constructed of different materials. If so, when the semiconductor device heats up due to operating or environmental factors, there will be a physical strain on the connections (i.e., lands 280 and heat spreader 290) between the semiconductor device and the PCB to which the semiconductor device is attached. The copper exposed pad of large heat spreader 290 reduces the CTE mismatch. The large exposed pad of heat spreader 290 more than compensates for the 4–6 mil nominal solder stand-off between the semiconductor device and the PCB. Heat spreader 290 dominates the overall solder joint strain, thus increasing the physical reliability of lands 280.

Electrical inductance is also reduced by the presence of downbonds as is explained next. In addition to electrical contact between the back side of semiconductor device chip 100 to die attach bond pad 240, additional connections can be made from preselected device electrodes 300 as needed, by down bonding from semiconductor device chip 100 to die attach bond pad 240. Referring back to FIG. 2, downbonds 295 allow the preselected device electrodes of the semiconductor device chip to be electrically connected to die attach bond pad 240 and to heat spreader 290 by way of the first group of vias 255. Using downbonds 295 will also lead to minimal inductance because the length of wire used is minimal, and it thus provides for a very good electrical and thermal path from semiconductor device chip 100 to the ground plane.

The semiconductor device just described is compatible with a simple manufacturing process that comprises overmolding a plurality of devices in a panelization scheme, and then sawing the overmolded devices into single devices at the end of the manufacturing process. This allows for the semiconductor device of the present invention to make use of portions of existing manufacturing processes.

Figure 5:
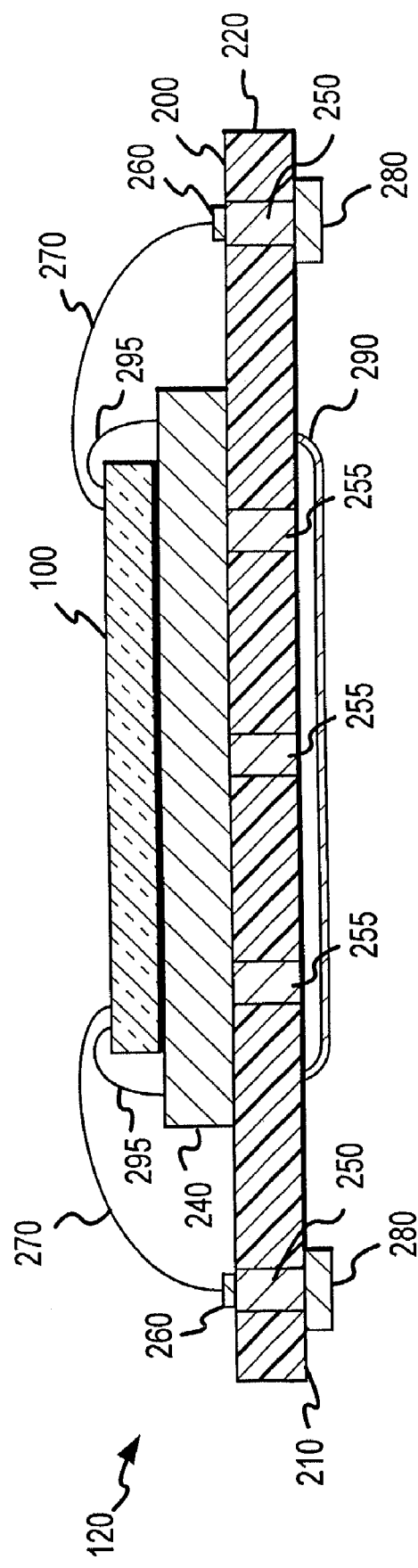
FIG. 5 illustrates, in cross-section view, a chip carrier in accordance with an alternate embodiment of the present invention.

In an alternative embodiment, the bond pads 260 and lands 280 may be co-located with the vias 250. For example, FIG. 5 illustrates a semiconductor device 120 according to that alternate embodiment of the invention. The interconnect substrate 220 may alternately be made of a ceramic material instead of a laminate material. When the interconnect substrate is made from a ceramic material, the plurality of bond pads 260 may be co-located with the second group of vias 250 on the upper surface. The plurality of lands 280 may also be co-located with the second group of vias 250 on the lower surface. This positioning of the bond pads and lands will save space, and thus will make it possible to form an electronic package that is even smaller than the previously described embodiment.

Although the present invention has been described in conjunction with particular embodiments illustrated in the appended drawing figures, various modification may be made without departing from the spirit and scope of the invention as set forth in the appended claims. For example, an alternate material may be used for the material of interconnect substrate 220, or bond pads 260 could be distributed in a different layout pattern on interconnect substrate 220. These and other modifications of the preferred embodiment are intended to be within the scope of the following claims.

I claim:

1. A structure comprising:
   a substrate having a top surface for receiving a chip, said chip having at least one device electrode;
   a die attach bond pad attached to said top surface of said substrate;
   a printed circuit board attached to a bottom surface of said substrate;
   at least one signal via in said substrate;
   at least one bond pad abutting said at least one signal via, said at least one bond pad providing electrical connection between said at least one device electrode of said chip and said printed circuit board;
   a plurality of separate thermally conductive vias in said substrate, each of said plurality of separate thermally conductive vias being coupled to a heat spreader, said heat spreader being directly attached to said bottom surface of said substrate;
   a downbond coupling said chip to said die attach bond pad.

2. The structure of claim 1 wherein said chip is a semiconductor chip.

3. The structure of claim 1 wherein said substrate comprises organic material.

4. The structure of claim 3 wherein said organic material is selected from the group consisting of polytetrafluoroethylene material and an FR4 based laminate material.

5. The structure of claim 1 wherein said substrate comprises a ceramic material.

6. The structure of claim 1 wherein said at least one signal via is coupled to said at least one bond pad without utilizing a trace.

7. The structure of claim 6 wherein said at least one signal via runs from said top surface of said substrate to said bottom surface of said substrate.

8. The structure of claim 6 wherein said bond pad is electrically connected to said device electrode by a bonding wire.

9. The structure of claim 1 wherein each of said at least one signal via provides an electrical connection between said device electrode and a land, said land being electrically connected to said printed circuit board.

10. The structure of claim 9 wherein said at least one signal via is coupled to said land.

11. The structure of claim 1 wherein each of said at least one signal via provides an electrical connection between one of said at least one bond pad and a land, wherein said land is electrically connected to said printed circuit board.

12. The structure of claim 11 wherein said each of said at least one signal via is coupled to said land.

13. The structure of claim 11 wherein said bond pad is electrically connected to said device electrode by a bonding wire.

14. The structure of claim 12 wherein said bond pad is electrically connected to said device electrode by a bonding wire.

15. The structure of claim 1 wherein said at least one signal via comprises copper.

16. The structure of claim 1 wherein said at least one signal via comprises a thermally conductive material.

17. A structure comprising:
   a substrate having a top surface and a bottom surface;
   a die attach bond pad attached to said top surface of said substrate;
   a semiconductor chip attached to said top surface of said substrate, said semiconductor chip having a plurality of device electrodes;
   a heat spreader directly attached to said bottom surface of said substrate;
   a first plurality of separate thermally conductive vias in said substrate, said first plurality of separate thermally conductive vias providing a connection between said semiconductor chip and said heat spreader;
   a plurality of bond pads and a second plurality of signal vias arranged such that each one of said plurality of bond pads abuts a separate one of said second plurality of signal vias;
   a downbond coupling said chip to said die attach bond pad.

18. The structure of claim 17 wherein said heat spreader is attached to a printed circuit board.

19. The structure of claim 18 wherein said second plurality of signal vias is located in said substrate to provide connections between said plurality of device electrodes of said semiconductor chip and said printed circuit board.

20. The structure of claim 17 wherein said first plurality of separate thermally conductive vias provide an electrical connection between said semiconductor chip and said heat spreader.

21. The structure of claim 17 wherein said first plurality of separate thermally conductive vias provide a thermal connection between said semiconductor chip and said heat spreader.

22. The structure of claim 19 wherein said second plurality of signal vias provide electrical connections between said plurality of bond pads and said printed circuit board, wherein each of said plurality of bond pads is electrically connected to a respective one of said plurality of device electrodes.

23. The structure of claim 19 wherein said second plurality of signal vias provide electrical connections between each one of said plurality of device electrodes and a respective one of a plurality of lands, said plurality of lands being electrically connected to said printed circuit board.

24. The structure of claim 17 wherein said first plurality of separate thermally conductive vias comprise copper.

25. The structure of claim 19 wherein said second plurality of signal vias comprise copper.

* * * * *